United States Patent
Tao et al.

(10) Patent No.: US 6,399,515 B1
(45) Date of Patent: Jun. 4, 2002

(54) PLASMA ETCH METHOD FOR FORMING PATTERNED CHLORINE CONTAINING PLASMA ETCHABLE SILICON CONTAINING LAYER WITH ENHANCED SIDEWALL PROFILE UNIFORMITY

(75) Inventors: Hun-Jan Tao; Chia-Shiung Tsai, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/336,809

(22) Filed: Jun. 21, 1999

(51) Int. Cl.⁷ .............................................. H01L 21/302
(52) U.S. Cl. ...................... 438/734; 438/737; 438/725; 438/721; 438/717; 438/719; 438/714
(58) Field of Search ................. 438/714, 717, 438/719, 721, 725, 734, 737

(56) References Cited

U.S. PATENT DOCUMENTS

| | | | | |
|---|---|---|---|---|
| 4,472,237 A | * | 9/1984 | Deslauriers et al. | 156/643 |
| 4,937,643 A | * | 6/1990 | Deslauriers et al. | 357/23.8 |
| 5,271,799 A | | 12/1993 | Langley | 156/643 |
| 5,453,156 A | | 9/1995 | Cher et al. | 156/643.1 |
| 5,529,197 A | | 6/1996 | Grewal | 216/68 |
| 5,660,681 A | | 8/1997 | Fukuda et al. | 438/695 |

FOREIGN PATENT DOCUMENTS

| | | | |
|---|---|---|---|
| JP | 04-322426 | * | 11/1992 |
| JP | 07-022391 | * | 1/1995 |
| JP | 07-094469 | * | 4/1995 |

* cited by examiner

*Primary Examiner*—George Goudreau
(74) *Attorney, Agent, or Firm*—George O. Saile; Stephen B. Ackerman; Stephen G. Stanton (57) ABSTRACT

A method for forming a patterned silicon containing layer. There is first provided a substrate. There is then formed over the substrate a blanket silicon containing layer. There is then formed over the blanket silicon containing layer a patterned photoresist layer. There is then etched, while employing a first plasma etch method in conjunction with the patterned photoresist layer as a first etch mask layer, the blanket silicon containing layer to form a partially etched blanket silicon containing layer. The first plasma etch method employs a first etchant gas composition comprising an etchant gas which upon plasma activation forms an active fluorine containing etchant species. There is then etched, while employing a second plasma etch method in conjunction with the patterned photoresist layer as a second etch mask layer the partially etched blanket silicon containing layer to form a fully patterned silicon containing layer. The second plasma etch method employs a second etchant gas composition which upon plasma activation forms an active halogen containing etchant species other than an active fluorine containing etchant species. The present invention also contemplates an embodiment which incorporates a blanket hard mask layer formed interposed between the blanket silicon containing layer and the patterned photoresist layer. The present invention may be employed for forming gate electrodes within field effect transistors (FETs).

12 Claims, 3 Drawing Sheets

PLASMA ETCH METHOD FOR FORMING PATTERNED CHLORINE CONTAINING PLASMA ETCHABLE SILICON CONTAINING LAYER WITH ENHANCED SIDEWALL PROFILE UNIFORMITY

BACKGROUND OF THE INVENTION

1. Field of the Invention

The present invention relates generally to methods for forming patterned layers within microelectronic fabrications. More particularly, the present invention relates to methods for forming patterned chlorine containing plasma etchable silicon containing layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly important within the art of microelectronic fabrication to form within microelectronic fabrications patterned microelectronic conductor layers, such as but not limited to: (1) gate electrodes within field effect transistors (FETs) within semiconductor integrated circuit microelectronic fabrications, as well as; (2) patterned microelectronic conductor interconnect layers, with uniform sidewall profile. Uniform sidewall profiles are particularly desirable within gate electrodes within field effect transistors (FETs) within semiconductor integrated circuit microelectronic fabrications since gate electrode linewidth and profile within a field effect transistor (FET) within a semiconductor integrated circuit microelectronic fabrication defines a channel width within the field effect transistor (FET) within the semiconductor integrated circuit microelectronic fabrication which in turn defines operational parameters of the semiconductor integrated circuit microelectronic fabrication within which is formed the field effect transistor (FET). Similarly, uniform sidewall profiles are desirable within patterned microelectronic conductor interconnect layers within microelectronic fabrications insofar as current carrying capacity of a patterned microelectronic conductor layer of diminished linewidth and enhanced aspect ratio is generally adversely affected by non-uniform sidewall profile.

While a uniform, and preferably perpendicular, sidewall profile is thus desirable within the art of microelectronic fabrication for forming patterned microelectronic conductor layers within microelectronic fabrications, uniform sidewall profiles are nonetheless not entirely readily achievable when forming, in general, patterned microelectronic conductor layers within microelectronic fabrications, and more particularly when forming gate electrodes within field effect transistors (FETs) within semiconductor integrated circuit microelectronic fabrications.

It is thus towards the goal of forming within a microelectronic fabrication a patterned microelectronic conductor layer, such as but not limited to a gate electrode within a field effect transistor (FET) within a semiconductor integrated circuit microelectronic fabrication, with enhanced sidewall profile uniformity, that the present invention is directed.

Various methods have been disclosed in the art of microelectronic fabrication for forming patterned microelectronic layers with desirable properties within microelectronic fabrications.

For example, Langley, in U.S. Pat. No. 5,271,799, discloses an anisotropic plasma etch method for forming with a uniform sidewall profile of at or near 90 degrees from a horizontal a patterned silicon oxide/metal silicide/polysilicon stack layer within a microelectronic fabrication. The anisotropic plasma etch method employs a single parallel plate plasma reactor chamber with a single inert cathode, where within the anisotropic plasma etch method there is varied within a silicon oxide etch step, a plasma power, an electrode spacing and a reactant gas composition in comparison with a metal silicide/polysilicon etch step within the anisotropic plasma etch method.

In addition, Cher et al., in U.S. Pat. No. 5,453,156, discloses an anisotropic plasma etch method for forming within an integrated circuit microelectronic fabrication a residue free patterned polysilicon layer or a residue free gate electrode structure, also with uniform sidewall profile. The method employs interposed between: (1) a main etch step employing a chlorine containing etchant gas composition when forming the residue free patterned polysilicon layer or the residue free gate electrode structure; and (2) an over etch step employing the chlorine containing etchant gas composition when forming the residue free patterned polysilicon layer or the residue free gate electrode structure, a passivation etch employing a fluorine containing etchant gas composition when forming the residue free patterned polysilicon layer or the residue free gate electrode structure within the integrated circuit microelectronic fabrication.

Further, Grewal, in U.S. Pat. No. 5,529,197, discloses an anisotropic plasma etch method for forming, with attenuated plasma charging damage, a polysilicon or a polycide stacked gate array within an integrated circuit microelectronic fabrication. The anisotropic plasma etch method employs a plasma reactor chamber having an upper inductive coil and a lower capacitive means, where the upper inductive coil is powered to a power of substantially less than 300 watts.

Finally, Fukuda et al., in U.S. Pat. No. 5,660,681, disclose an anisotropic plasma etch method for forming a residue free patterned silicon based material layer, such as a patterned polysilicon layer or a patterned polycide layer, within an integrated circuit microelectronic fabrication. The anisotropic plasma etch method employs: (1) a first plasma employing a first etchant gas composition comprising a non-fluorine halogen based chemical species and an oxygen based chemical species to form the patterned silicon based material layer having a non-stoichiometric silicon oxide sidewall protective layer formed thereupon, followed by; (2) a second plasma employing a second etchant gas composition comprising an oxygen based etchant gas composition for stripping from over the patterned silicon based material layer a patterned photoresist layer employed in defining the patterned silicon based material layer while simultaneously oxidizing the non-stoichiometric silicon oxide sidewall protective layer to form a stoichiometric silicon oxide sidewall protective layer, followed by; (3) stripping the substantially stoichiometric silicon oxide sidewall protective layer with a dilute hydrofluoric acid solution.

Desirable in the art of microelectronic fabrication are additional methods for forming within a microelectronic fabrication a patterned microelectronic conductor layer, such as but not limited to a gate electrode within a field effect transistor (FET) within a semiconductor integrated circuit microelectronic fabrication, with enhanced sidewall profile uniformity.

It is towards that object that the present invention is directed.

SUMMARY OF THE INVENTION

A first object of the present invention is to provide a method for forming within a microelectronic fabrication a patterned silicon containing layer, such as but not limited to a gate electrode within a field effect transistor (FET) within a semiconductor integrated circuit microelectronic fabrication.

A second object of the present invention is to provide a method in accord with the first object of the present invention, where the patterned silicon containing layer is formed with enhanced sidewall profile uniformity.

A third object of the present invention is to provide a method in accord with the first object of the present invention and the second object of the present invention, which method is readily commercially implemented.

In accord with the objects of the present invention, there is provided by the present invention a method for forming a patterned silicon containing layer within a microelectronic fabrication. To practice the method of the present invention, there is first provided a substrate. There is then formed over the substrate a blanket silicon containing layer. There is then formed over the blanket silicon containing layer a patterned photoresist layer. There is then etched, while employing a first plasma etch method in conjunction with the patterned photoresist layer as a first etch mask layer, the blanket silicon containing layer to form a partially etched blanket silicon containing layer. The first plasma etch method employs a first etchant gas composition comprising an etchant gas which upon plasma activation forms an active fluorine containing etchant species. There is then etched, while employing a second plasma etch method in conjunction with the patterned photoresist layer as a second etch mask layer, the partially etched blanket silicon containing layer to form a fully patterned silicon containing layer. The second plasma etch method employs a second etchant gas composition which upon plasma activation forms an active halogen containing etchant species other than an active fluorine containing etchant species.

The present invention also contemplates an embodiment which employs a blanket hard mask layer formed interposed between the blanket silicon containing layer and the patterned photoresist layer. Such an embodiment provides additional process latitude in forming the fully patterned silicon containing layer.

There is provided by the present invention a method for forming within a microelectronic fabrication a patterned silicon containing layer, such as but not limited to a gate electrode within a field effect transistor (FET) within a semiconductor integrated circuit microelectronic fabrication, where the patterned silicon containing layer is formed with uniform sidewall profile. The method of the present invention realizes the foregoing object by etching a blanket silicon containing layer from which is formed the patterned silicon containing layer first within a first plasma etch method employing a first etchant gas composition which upon plasma activation forms an active fluorine containing etchant species to form from the blanket silicon containing layer a partially etched blanket silicon containing layer. The partially etched blanket silicon containing layer is then etched within a second plasma etch method employing a second etchant gas composition which upon plasma activation forms an active halogen containing etchant species other than an active fluorine containing etchant species to form from the partially etched blanket silicon containing layer a fully patterned silicon containing layer.

The method of the present invention is readily commercially implemented. The present invention employs methods and materials as are otherwise generally known in the art of microelectronic fabrication. Since it is a process ordering and process control which provides at least in part the present invention, rather than the existence of methods and materials which provides the present invention, the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The present invention provides a method for forming within a microelectronic fabrication a patterned silicon containing layer, such as but not limited to a gate electrode within a field effect transistor (FET) within a semiconductor integrated circuit microelectronic fabrication, where the patterned silicon containing layer is formed with uniform sidewall profile. The method of the present invention realizes the foregoing object by etching a blanket silicon containing layer from which is formed the patterned silicon containing layer first within a first plasma etch method employing a first etchant gas composition which upon plasma activation forms an active fluorine containing etchant species to form from the blanket silicon containing layer a partially etched blanket silicon containing layer. The partially etched blanket silicon containing layer is then etched while employing a second plasma etch method employing a second etchant gas composition which upon plasma activation forms an active halogen containing etchant species other than an active fluorine containing etchant species to form from the partially etched blanket silicon containing layer a fully patterned silicon containing layer.

Although the present invention provides substantial value for forming with uniform sidewall profile patterned silicon containing layers which are employed as gate electrodes within field effect transistors (FETs) within semiconductor integrated circuit microelectronic fabrications, the method of the present invention may also be employed for forming patterned silicon containing layers other than patterned silicon containing layers employed as gate electrodes within field effect transistors (FETs) within semiconductor integrated circuit microelectronic fabrications. In that regard, the present invention may be employed for forming patterned silicon containing layers including but not limited to patterned amorphous silicon layers, patterned monocrystalline silicon layers, patterned polycrystalline silicon layers and patterned polycide (i.e. polysilicon/metal silicide stack) layers, any of the foregoing layers being either doped or un-doped, as patterned conductive silicon containing layers, patterned semiconductor silicon containing layers and patterned dielectric silicon containing layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 1:
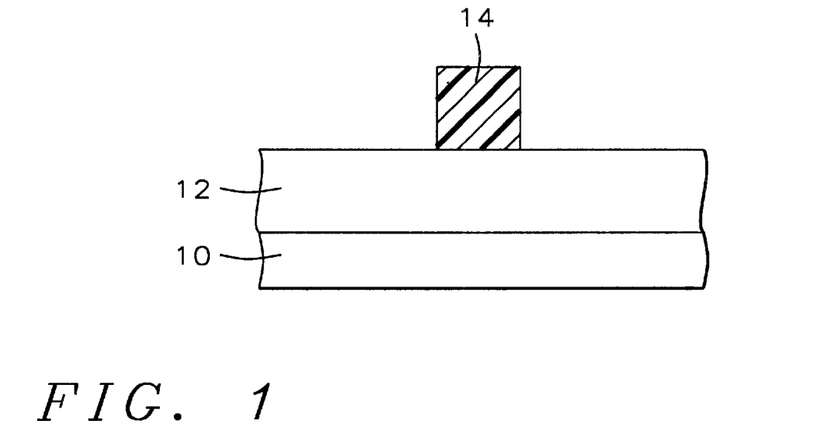
FIG. 1, FIG. 2 and FIG. 3 shown a series of schematic cross-sectional diagrams illustrating the results of forming, in accord with a general embodiment of the present invention which comprises a first preferred embodiment of the present invention, a patterned silicon containing layer within a microelectronic fabrication.
Figure 2:
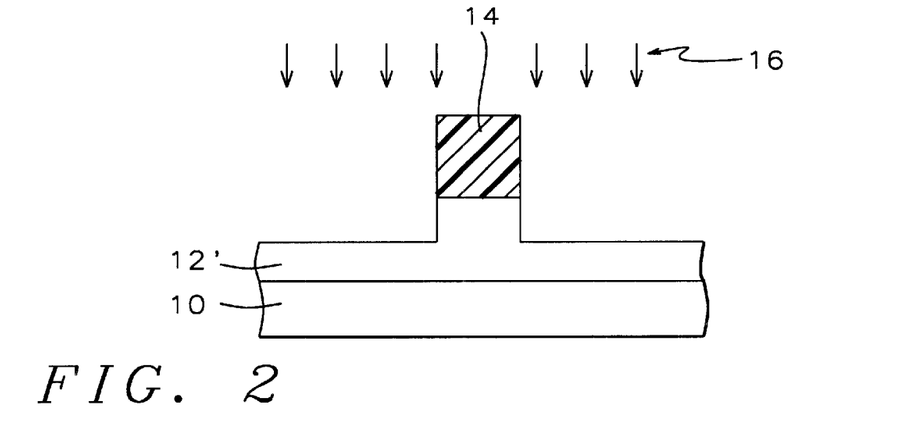
Figure 3:
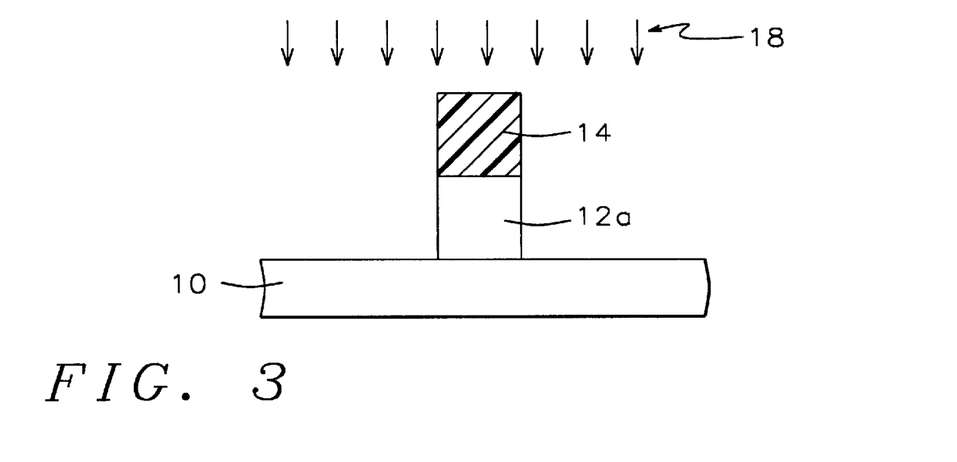

Referring now to FIG. 1 to FIG. 3, there is shown a series of schematic cross-sectional diagrams illustrating the results of forming, in accord with a general embodiment of the present invention which comprises a first preferred embodiment of the present invention, a patterned silicon containing layer within a microelectronic fabrication. Shown in FIG. 1 is a schematic cross-sectional diagram of the microelectronic fabrication at an early stage in its fabrication in accord with the first preferred embodiment of the present invention.

Shown in FIG. 1 is a substrate 10, having formed thereover a blanket silicon containing layer 12 in turn having formed thereover a patterned photoresist layer 14. Within the first preferred embodiment of the present invention, each of the foregoing substrate 10, blanket silicon containing layer 12 and patterned photoresist layer 14 may be formed employing methods and materials as are conventional in the art of microelectronic fabrication.

For example, within the first preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may a substrate alone as employed within a microelectronic fabrication, or in the alternative, the substrate 10 may be the substrate as employed within the microelectronic fabrication, where the substrate has formed thereupon and/or thereover, and thus incorporated therein, any of several additional layers as are conventionally employed within the microelectronic fabrication within which is employed the substrate 10. Similarly with the substrate alone, such additional microelectronic layers may independently be formed from microelectronic materials including but not limited to microelectronic conductor materials, microelectronic semiconductor materials and microelectronic dielectric materials.

In addition, within the first preferred embodiment of the present invention with respect to the blanket silicon containing layer 12, the blanket silicon containing layer 12 may be formed of silicon containing materials including but not limited to amorphous silicon materials, monocrystalline silicon materials, polycrystalline silicon materials and polycide (i.e. polysilicon/metal silicide stack) materials, where any of the foregoing silicon containing materials may additionally be doped with electrically active or electrically inactive dopants as are conventional in the art of microelectronic fabrication. Within the present invention and the first preferred embodiment of the present invention, the silicon containing material from which is formed the blanket silicon containing layer 12 is susceptible to etching within both: (1) a first plasma etch method employing a first etchant gas composition which upon plasma activation forms an active fluorine containing etchant species; and (2) a second plasma etch method employing a second etchant gas composition which upon plasma activation forms an active halogen containing etchant species other than an active fluorine containing etchant species. Typically and preferably, the blanket silicon containing layer 12 is formed over the substrate 10 to a thickness of from about 1000 to about 3000 angstroms.

Finally, within the first preferred embodiment of the present invention with respect to the patterned photoresist layer 14, the patterned photoresist layer 14 may be formed employing methods and photoresist materials as are conventional in the art of microelectronic fabrication, where the photoresist materials may include, but are not limited to positive photoresist materials and negative photoresist materials. Typically and preferably, the patterned photoresist layer 14 is formed of a positive photoresist material, formed to a thickness of from about 2000 to about 8000 angstroms over the blanket silicon containing layer 12 and defined by a linewidth of from about 0.05 to about 0.5 microns angstroms over the blanket silicon containing layer 12.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket silicon containing layer 12 has been partially etched to form the partially etched blanket silicon containing layer 12' through etching within a first plasma 16, while employing the patterned photoresist layer 14 as an etch mask layer. Within the first preferred embodiment of the present invention, the first plasma 16 employs a first etchant gas composition which upon plasma activation forms an active fluorine containing etchant species. As is illustrated within the schematic cross-sectional diagram of FIG. 2, from about ½ to about ⅔ of the thickness of the blanket silicon containing layer 12 is etched away in forming the partially etched blanket silicon containing layer 12'. Thus it is intended within the present invention and the first preferred embodiment of the present invention that a substantial amount of a blanket silicon containing layer, such as the blanket silicon containing layer 12, be etched in forming a corresponding partially etched blanket silicon containing layer, such as the partially etched blanket silicon containing layer 12'. The present invention intends that the substantial amount of the blanket silicon containing layer which is etched substantially exceeds a nominal minimal etching into a blanket silicon containing layer which may occur incident to over-etching a blanket hard mask layer formed upon a blanket silicon containing layer while employing a plasma etch method employing an etchant gas composition which upon plasma activation forms an active fluorine containing etchant species. See, for example, Langley, as cited within the Description of the Related Art, all of which related art is incorporated herein fully by reference.

Within the first preferred embodiment of the present invention with respect to the first plasma 16 which employs a first etchant gas composition which upon plasma activation forms an active fluorine containing etchant species, the first etchant gas composition may comprise at least one fluorine containing etchant gas selected from the group including but not limited to perfluorocarbons of up to about 4 carbon atoms, hydrofluorocarbons of up to about 4 carbon atoms, sulfur hexafluoride and nitrogen trifluoride, along with optional diluent gases as are desirable to provide a stabilized and uniform plasma. More preferably, the first etchant gas composition comprises at least one etchant gas which upon plasma activation provides an active fluorine containing etchant species without an etchant gas which upon plasma activation provides an active chlorine containing etchant species or an active bromine containing etchant species, along with optional diluent gases as are desirable to provide a stabilized and uniform plasma. Yet more preferably, the first plasma 16 employs a first etchant gas composition which preferably comprises a perfluorocarbon etchant gas such as but not limited to carbon tetrafluoride or hexafluoroethane.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the partially etched blanket silicon containing layer 12' has been further etched while employing a second plasma 18 to form the fully patterned silicon containing layer 12a.

Within the second preferred embodiment of the present invention, the second plasma 18 employs a second etchant gas composition which upon plasma activation forms an active halogen containing etchant species other than an active fluorine containing etchant species. The second etchant gas composition may comprise at least one etchant gas selected from the group including but not limited to chlorine, hydrogen chloride, bromine and hydrogen bromide, along with suitable diluent gases to provide a stabilized and uniform second plasma 18. More preferably, the second etchant gas composition comprises an etchant gas which upon plasma activation forms an active chlorine containing etchant species and an etchant gas which upon plasma activation forms an active bromine containing etchant species, along with suitable diluents to provide a stabilized plasma. The use of both an etchant gas which upon plasma activation forms an active chlorine containing etchant species and an etchant gas which upon plasma activation forms an active bromine containing etchant species provides increased process control within the present invention and enhanced sidewall profile uniformity of a patterned silicon containing layer formed employing the present invention, while also avoiding a deliberate addition of a carbonaceous material intended to provide for additional sidewall passivation. Yet more preferably, the second plasma 18 employs a second etchant gas composition preferably comprising chlorine and hydrogen bromide.

Upon forming the microelectronic fabrication whose schematic cross-sectional diagram is illustrated in FIG. 3, there is formed a microelectronic fabrication having formed therein a patterned silicon containing layer with enhanced sidewall profile uniformity. The patterned silicon containing layer is formed with the enhanced sidewall profile uniformity by employing when forming the patterned silicon containing layer from a corresponding blanket silicon containing layer in accord with the present invention a two step plasma etch method, where: (1) a first step within the two step plasma etch method employs a first plasma employing a first etchant gas composition which upon plasma activation forms a active fluorine containing etchant species; and (2) a second step within the two step plasma etch method employs a second etchant gas composition which upon plasma activation forms an active halogen containing etchant species other than an active fluorine containing etchant species.

Second Preferred Embodiment

Figure 4:
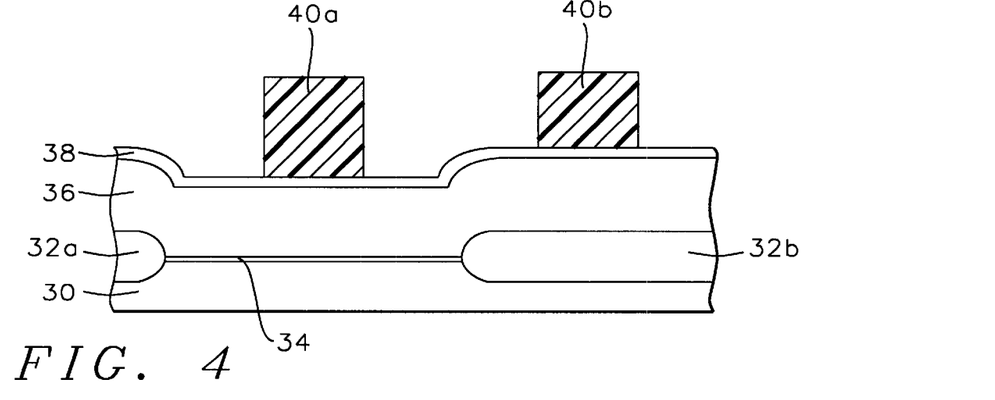
FIG. 4, FIG. 5, FIG. 6, FIG. 7 and FIG. 8 show a series of schematic cross-sectional diagrams illustrating the results of forming, in accord with a more specific embodiment of the present invention which comprises a second preferred embodiment of the present invention, a gate electrode within a field effect transistor (FET) within a semiconductor integrated circuit microelectronic fabrication.

Referring now to FIG. 4 to FIG. 8, there is shown a series of schematic cross-sectional diagrams illustrating the results of progressive stages in forming in accord with a more specific embodiment of the present invention which comprises a second preferred embodiment of the present invention a gate electrode within a field effect transistor (FET) within a semiconductor integrated circuit microelectronic fabrication. Shown in FIG. 4 is a schematic cross-sectional diagram of the semiconductor integrated circuit microelectronic fabrication at an early stage in its fabrication in accord with the second preferred embodiment of the present invention.

Shown in FIG. 4, in a first instance, is a semiconductor substrate 30 having formed within and upon its surface a pair of isolation regions 32a and 32b which define an active region of the semiconductor substrate 30.

Within the second preferred embodiment of the present invention with respect to the semiconductor substrate 30, although semiconductor substrates are known in the art of semiconductor integrated circuit microelectronic fabrication with either dopant polarity, any of several dopant concentrations and various crystallographic orientations, for the second preferred embodiment of the present invention, the semiconductor substrate 30 is typically and preferably a (100) silicon semiconductor substrate having an N- or P- doping.

Similarly, although it is also known in the art of semiconductor integrated circuit microelectronic fabrication that isolation regions may be formed within and/or upon semiconductor substrates to define active regions of those semiconductor substrates while employing methods including but not limited to isolation region thermal growth methods and isolation region deposition/patterning methods, for the second preferred embodiment of the present invention, the isolation regions 32a and 32b are typically and preferably formed within and upon the semiconductor substrate 30 to define the active region of the semiconductor substrate 30 while employing an isolation region thermal growth method at a temperature of from about 700 to about 900 degrees centigrade to form the isolation regions 32a and 32b of silicon oxide formed within and upon the semiconductor substrate 30.

Shown also within FIG. 4 formed upon the active region of the semiconductor substrate 30 is a gate dielectric layer 34. Although it is known in the art of semiconductor integrated circuit microelectronic fabrication that gate dielectric layers may be formed employing methods including but not limited to gate dielectric layer thermal growth methods and gate dielectric layer deposition/patterning methods, for the second preferred embodiment of the present invention, the gate dielectric layer 34 is typically and preferably formed employing a gate dielectric layer thermal growth method at a temperature of from about 700 to about 900 degrees centigrade to form the gate dielectric layer 34 of silicon oxide formed upon the active regions of the semiconductor substrate 30.

Shown also within FIG. 4 formed over the semiconductor substrate 30 including the isolation regions 32a and 32b and the gate dielectric layer 34 is a pair of blanket layers comprising: (1) a blanket gate electrode material layer 36 formed upon the isolation regions 32a and 32b and the gate dielectric layer 34; and (2) a blanket hard mask layer 38 formed upon the blanket gate electrode material layer 36. Finally, there is also shown within the schematic cross-sectional diagram of FIG. 4 a pair of patterned photoresist layers 40a and 40b formed upon the blanket hard mask layer 38. Each of the foregoing pair of blanket layers, as well as the pair of patterned photoresist layers 40a and 40b, may be formed employing methods as are conventional in the art of semiconductor integrated circuit microelectronic fabrication.

For example, and similarly with the blanket silicon containing layer 12 as employed within the first preferred embodiment of the present invention as illustrated within the schematic cross-sectional diagram of FIG. 1, the blanket gate electrode material layer 36 may be formed of gate electrode materials including but not limited to amorphous silicon materials, polycrystalline silicon materials and polycide materials, typically and preferably doped to a level of greater than about 1E20 dopant atoms per cubic centimeter, in order to assure optimal conductivity. Although not specifically illustrated within the schematic cross-sectional diagram of FIG. 4, the present invention provides optimal value when the blanket gate electrode material layer 36 is formed at least in part of a doped polysilicon material which has not been thermally annealed. The blanket gate electrode material layer 36 may be formed employing methods as are conventional in the art of semiconductor integrated circuit microelectronic fabrication, including but not limited to chemical vapor deposition (CVD) methods, plasma enhanced chemical vapor deposition (PECVD) methods and physical vapor deposition (PVD) methods. Typically and preferably, the blanket gate electrode material layer 36 is formed to a thickness of from about 1500 to about 2500 angstroms.

In addition, within the second preferred embodiment of the present invention with respect to the blanket hard mask layer 38, although the blanket hard mask layer 38 may be formed employing any of several hard mask materials, including but not limited to conductor hard mask materials, semiconductor hard mask materials and dielectric hard mask materials, for the second preferred embodiment of the present invention, the blanket hard mask layer 38 is typically and preferably formed employing a dielectric hard mask material, such as but not limited to a silicon oxide dielectric hard mask material, a silicon nitride dielectric hard mask material or a silicon oxynitride dielectric hard mask material, in order to provide optimal processing latitude when further fabricating the semiconductor integrated circuit microelectronic fabrication whose schematic cross-sectional diagram is illustrated in FIG. 4. Such dielectric hard mask materials may be formed employing methods as are conventional in the art of microelectronic fabrication, including but not limited to chemical vapor deposition (CVD) methods, plasma enhanced chemical vapor deposition (PECVD) methods and physical vapor deposition (PVD) methods. Typically and preferably, the blanket hard mask layer 38 is formed to a thickness of from about 100 to about 3000 angstroms.

While the present description illustrates the blanket hard mask layer 38 as being formed within only the second preferred embodiment of the present invention, a corresponding blanket hard mask layer may also be employed within the first preferred embodiment of the present invention. Similarly, although the blanket hard mask layer 38 may be optional within the second preferred embodiment of the present invention, the blanket hard mask layer 38 is preferred within the present invention and the second preferred embodiment of the present invention insofar as the presence of the blanket hard mask layer 38 provides for enhanced process latitude and superior sidewall profile uniformity when forming patterned silicon containing layers in accord with the present invention.

Finally, within the second preferred embodiment of the present invention with respect to the pair of patterned photoresist layers 40a and 40b, similarly with the patterned photoresist layer 14 as employed within the first preferred embodiment of the present invention as illustrated within the schematic cross-sectional diagram of FIG. 1, the pair of patterned photoresist layers 40a and 40b may be formed from any of several photoresist materials selected from the general groups of photoresist materials including but not limited to positive photoresist materials and negative photoresist materials. Typically and preferably, each of the patterned photoresist layers 40a and 40b is formed to a thickness of from about 2000 to about 8000 angstroms upon the blanket hard mask layer 38.

Figure 5:
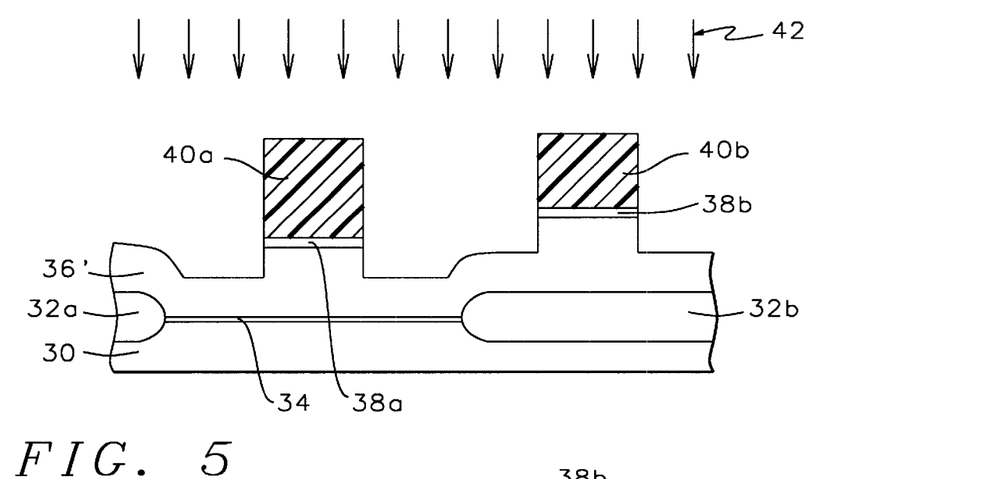

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein: (1) the blanket hard mask layer 38 has been patterned to form a pair of patterned hard mask layers 38a and 38b; and (2) the blanket gate electrode material layer 36 has been partially etched to form the partially etched blanket gate electrode material layer 36', through etching within a first plasma 42.

Within the second preferred embodiment of the present invention, the first plasma 42 is preferably formed employing materials and process parameters analogous or equivalent to the materials and process parameters employed in forming the first plasma 16 employed within the first preferred embodiment of the present invention, as illustrated within the schematic cross-sectional diagram of FIG. 2. More preferably, within the second preferred embodiment of the present invention, the first plasma 42 employs a first etchant gas composition comprising carbon tetrafluoride or hexafluoroethane, as well as, optionally, chlorine and/or hydrogen bromide and/or oxygen and/or helium.

When etching the blanket hard mask layer 38 and the blanket gate electrode material layer 36 to provide the corresponding patterned hard mask layers 38a and 38b and the corresponding partially etched blanket gate electrode material layer 36' upon an eight inch diameter semiconductor substrate 30, the first plasma etch method which employs the first plasma 42 also employs: (1) a reactor chamber pressure of from about 5 to about 30 mtorr; (2) a source radio frequency power of from about 100 to about 500 watts at a source radio frequency of 13.56 MHZ; (3) a bias power of from about 50 to about 300 watts; (4) a carbon tetrafluoride or hexafluoroethane flow rate of from about 10 to about 100 standard cubic centimeters per minute (sccm); (5) a chlorine flow rate of up to about 200 standard cubic centimeters per minute (sccm); (6) a hydrogen bromide flow rate of up to about 200 standard cubic centimeters per minute (sccm); (7) an oxygen flow rate of up to about 5 standard cubic centimeters per minute (sccm) and (8) a helium flow rate of up to about 200 standard cubic centimeters per minute (sccm).

Figure 6:
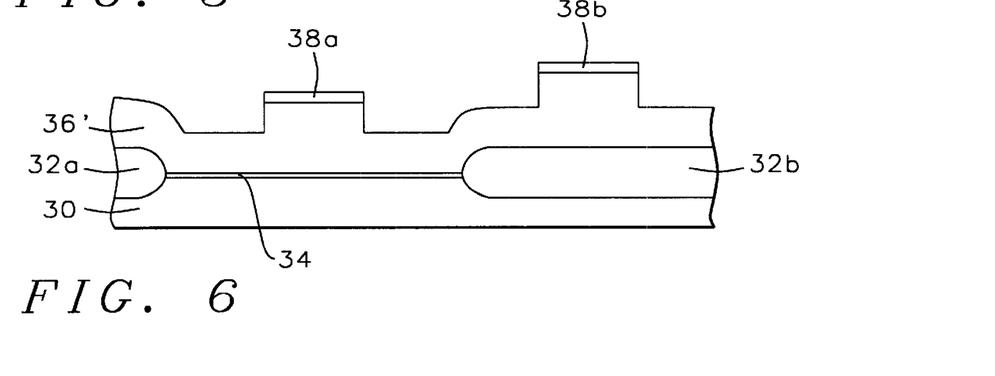

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is stripped from the pair of patterned hard mask layers 38a and 38b the corresponding pair of patterned photoresist layers 40a and 40b. Although it is not absolutely essential to the second preferred embodiment of the present invention that the pair of patterned photoresist layers 40a and 40b is stripped immediately subsequent to etching: (1) the blanket hard mask layer 38 to form the patterned hard mask layers 38a and 38b; and (2) the blanket gate electrode material layer 36 to form the partially etched blanket gate electrode material layer 36', the patterned photoresist layers 40a and 40b are preferably stripped from the pair of patterned hard mask layers 38a and 38b at a point in time when the blanket gate electrode material layer 36 has been only partially etched to form the partially etched blanket gate electrode material layer 36', and prior to additional processing of the partially etched blanket gate electrode material layer 36'.

To provide the microelectronic fabrication whose schematic cross-sectional diagram is illustrated in FIG. 6 from the microelectronic fabrication whose schematic cross-sectional diagram is illustrated in FIG. 5, the pair of patterned photoresist layers 40a and 40b may be stripped from the pair of hard mask layers 38a and 38b while employing stripping methods as are conventional in the art of microelectronic fabrication, such stripping methods including but not limited to dry oxygen plasma stripping methods and wet chemical solvent photoresist stripping methods.

Although not specifically illustrated within the schematic cross-sectional diagram of FIG. 5, there is typically formed upon sidewall portions of the patterned hard mask layers 38a and 38b, and the partially etched blanket gate electrode material layer 36' passivating fluorocarbon containing residue layers. It is generally preferred within the second preferred embodiment of the present invention to strip such passivating fluorocarbon containing residue layers simultaneously with the pair of patterned photoresist layers 40a and 40b.

Figure 7:
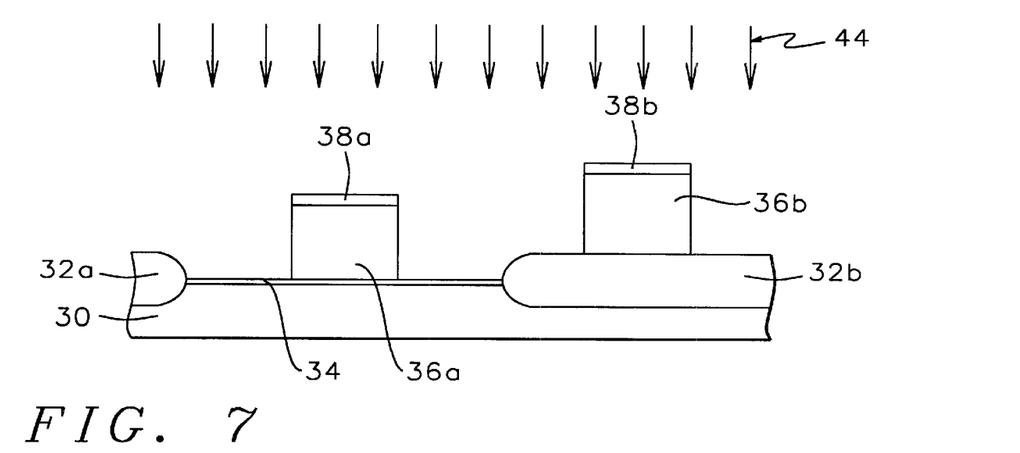

Referring now to FIG. 7, there is shown a schematic cross-sectional diagram illustrating the results of further processing of the microelectronic fabrication whose schematic cross-sectional diagram is illustrated in FIG. 6. Shown in FIG. 7 is a schematic cross-sectional diagram of a microelectronic fabrication otherwise equivalent to the microelectronic fabrication whose schematic cross-sectional diagram is illustrated within FIG. 6, but wherein the partially etched blanket gate electrode material layer 36' has been patterned to form a gate electrode 36a and an interconnect 36b, through etching within a second plasma 44, while employing the pair of patterned hard mask layers 38a and 38b as a pair of etch mask layers.

Within the second preferred embodiment of the present invention, the second plasma 44 is preferably formed employing materials and parameters analogous or equivalent to the materials and parameters employed for forming the second plasma 18 as employed within the first preferred embodiment of the present invention as illustrated within the schematic cross-sectional diagram of FIG. 3. More preferably, within the second preferred embodiment of the present invention, the second plasma 44 employs a second etchant gas composition comprising chlorine and hydrogen bromide, along with an optional helium/oxygen gas mixture to provide a stabilized and uniform second plasma 44.

Within the second preferred embodiment of the present invention when employing the second plasma 44 to etch the partially etched blanket gate electrode material layer 36' to form the gate electrode 36a and the interconnect 36b upon an eight inch diameter semiconductor substrate 30, the second plasma etch method which employs the second plasma 44 also employs: (1) a reactor chamber pressure of from about 5 to about 30 mtorr; (2) a source radio frequency power of from about 100 to about 500 watts at a source radio frequency of 13.56 MHZ; (3) a bias power of from about 50 to about 300 watts; (4) a semiconductor substrate 30 temperature of from about 50 to about 150 degrees centigrade; (5) a chlorine flow rate of from about 20 to about 200 standard cubic centimeters per minute (sccm); (6) a hydrogen bromide flow rate of from about 50 to about 500 standard cubic centimeters per minute (sccm); and (7) a helium:oxygen (70:30 vol:vol) flow rate of up to about 15 standard cubic centimeters per minute (sccm).

Figure 8:
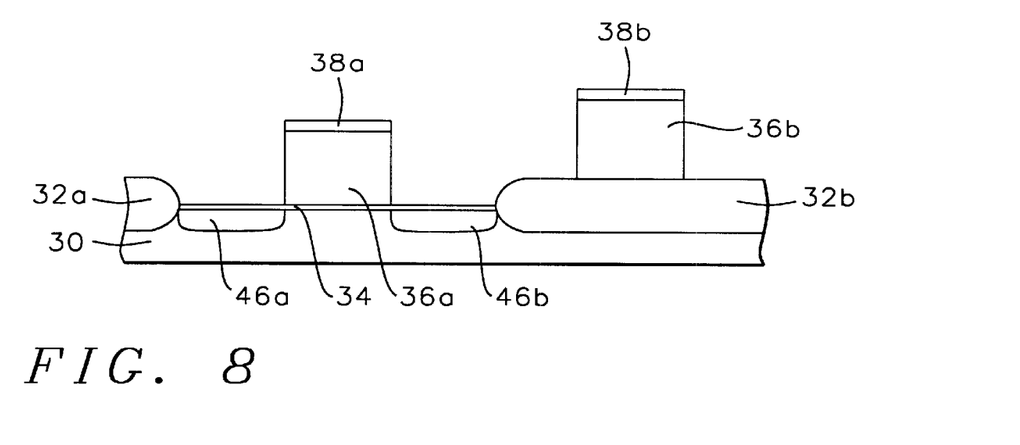

Referring now to FIG. 8, there is shown a schematic cross-sectional diagram illustrating the results of further processing of the semiconductor integrated circuit microelectronic fabrication whose schematic cross-sectional diagram is illustrated in FIG. 7. Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein there is formed into the active region of the semiconductor substrate 30 at areas not covered by the gate electrode 36a and the patterned hard mask layer 38a a pair of source/drain regions 46a and 46b.

Within the second preferred embodiment of the present invention, the pair of source/drain regions 46a and 46b may be formed into the active region of the semiconductor substrate 30 at areas not covered by the gate electrode 36a and the patterned hard mask layer 38a while employing methods as are conventional in the art of semiconductor integrated circuit microelectronic fabrication. Such methods will typically include, but are not limited to, ion implantation methods employing implantation of electrically active dopant ions into the active region of the semiconductor substrate 30 at areas not covered by the gate electrode 36a and the patterned hard mask layer 38a.

Upon forming the semiconductor integrated circuit microelectronic fabrication whose schematic cross-sectional diagram is illustrated in FIG. 8, there is formed a semiconductor integrated circuit microelectronic fabrication having formed therein a field effect transistor (FET) having formed therein a gate electrode with enhanced sidewall profile uniformity. The gate electrode is formed with enhanced sidewall profile uniformity insofar as there is employed when forming the gate electrode: (1) a first plasma etch method which is employed for forming from a blanket gate electrode material layer a partially etched blanket gate electrode material layer; and (2) a second plasma etch method employed for forming from the partially etched blanket gate electrode material layer a fully patterned gate electrode. Within the present invention and the second preferred embodiment of the present invention, the first plasma etch method employs a first etchant gas composition which upon plasma activation provides an active fluorine containing etchant species, while the second plasma etch method employs a second etchant gas composition which upon plasma activation provides an active halogen containing etchant species other than an active fluorine containing etchant species.

As is understood by a person skilled in the art, the preferred embodiments of the present invention are illustrative of the present invention rather than limiting of the present invention. Revisions and modifications may be made to methods, materials, structures and dimensions through which is provided a microelectronic fabrication in accord with the preferred embodiments of the present invention, while still providing a microelectronic fabrication in accord with the present invention, in accord with the accompanying claims.

What is claimed is:

1. A method for forming a patterned polysilicon layer comprising:

providing a substrate;

forming over the substrate a blanket polysilicon layer having a thickness of from about 1000 to 3000 Å;

forming over the blanket polysilicon layer a patterned photoresist layer having a thickness of from about 2000 to 8000 Å;

etching, while employing a first plasma etch method in conjunction with the patterned photoresist layer as a first etch mask layer, the blanket polysilicon layer to form a partially etched blanket polysilicon layer, wherein from about ½ to ⅔ of the thickness of the blanket polysilicon layer is etched in forming the partially etched blanket polysilicon layer; the first plasma etch method employing a first etchant gas composition comprising an etchant gas which upon plasma activation forms an active fluorine containing etchant species but without an active chlorine containing species or an active bromine containing etchant species; and etching, while employing a second plasma etch method in conjunction with the patterned photoresist layer as a second etch mask layer the partially etched blanket polysilicon layer to form a fully patterned polysilicon layer, the second plasma etch method employing a second etchant gas composition which upon plasma activation forms an active halogen containing etchant species other than an active fluorine containing etchant species; the active halogen containing etchant species of the second plasma etch method comprising an active chlorine containing species and an active bromine containing etchant species.

2. The method of claim 1, wherein by employing:

the first plasma etch method to form from the blanket polysilicon layer the partially etched blanket silicon containing layer; and the second plasma etch method to form from the partially etched blanket polysilicon layer the fully patterned silicon containing layer; the fully patterned polysilicon layer is formed with enhanced sidewall profile uniformity.

3. The method of claim 1, wherein the substrate is employed within a microelectronic fabrication selected from the group consisting of integrated circuit microelectronic fabrications, ceramic substrate microelectronic fabrications, solar cell optoelectronic microelectronic fabrications, sensor image array microelectronic fabrications and display image array optoelectronic microelectronic fabrications.

4. The method of claim 1, wherein the patterned polysilicon layer is employed as a gate electrode within a field effect transistor (FET).

5. The method of claim 1, wherein there is not formed a blanket hard mask layer interposed between the blanket polysilicon layer and the patterned photoresist layer.

6. The method of claim 1, wherein the patterned photoresist layer is stripped after the first plasma etch method and before the second plasma etch method.

7. The method of claim 1, wherein the patterned photoresist layer is stripped after the second plasma etch method.

8. The method of claim 1, wherein the blanket polysilicon layer is from about 1500 to 2500 Å thick.

9. The method of claim 1, wherein the first plasma etch method employs the following parameters for an eight inch diameter substrate: a reactor chamber pressure of from about 5 to 30 mTorr; a source radio frequency power of from about 100 to 500 watts at a source radio frequency of 13.56 MHz; a bias power of from about 50 to 300 watts; a carbon tetrafluoride or sulfur hexafluoride flow rate of from about 10 to 100 sccm; an oxygen flow rate of up to about 5 sccm; an a helium flow rate of up to about 200 sccm.

10. The method of claim 1, wherein the second plasma etch method employs the following parameters for an eight inch diameter substrate: a reactor chamber pressure of from about 5 to 30 mTorr; a source radio frequency power of from about 100 to 500 watts at a source radio frequency of 13.56 MHz; a bias power of from about 50 to 300 watts; a substrate temperature of from about 50 to 150° C.; a chlorine flow rate of from about 20 to 200 sccm; a hydrogen bromide flow rate of from about 50 to 500 sccm; and a helium: oxygen (70:30 vol.: vol.) flow rate of up to about 15 sccm.

11. The method of claim 1, wherein the first etchant gas composition is comprised of at least one gas selected from the group consisting of: perfluorocarbons of up to about 4 carbon atoms; sulfur hexafluoride; and nitrogen trifluoride.

12. The method of claim 1, wherein the second etchant gas composition is comprised of at least one gas selected from the group consisting of: chlorine, hydrogen chloride, bromine and hydrogen bromide.

* * * * *